US011188244B2

(12) United States Patent
Sato

(10) Patent No.: US 11,188,244 B2
(45) Date of Patent: Nov. 30, 2021

(54) ADJUSTING TRIM SETTINGS TO IMPROVE MEMORY PERFORMANCE OR RELIABILITY

(71) Applicant: Micron Technology, Inc., Boise, ID (US)

(72) Inventor: Junichi Sato, Yokohama (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/848,766

(22) Filed: Apr. 14, 2020

(65) Prior Publication Data

US 2021/0318821 A1 Oct. 14, 2021

(51) Int. Cl.
  *G06F 13/00* (2006.01)
  *G06F 3/06* (2006.01)
  *G11C 29/38* (2006.01)

(52) U.S. Cl.
  CPC ........ *G06F 3/0632* (2013.01); *G06F 3/0604* (2013.01); *G06F 3/0659* (2013.01); *G06F 3/0679* (2013.01); *G11C 29/38* (2013.01)

(58) Field of Classification Search
  CPC .... G06F 3/0632; G06F 3/0679; G06F 3/0604; G06F 3/0659; G11C 29/38
  See application file for complete search history.

(56) References Cited

U.S. PATENT DOCUMENTS

| 5,801,985 | A * | 9/1998 | Roohparvar | G11C 29/021 |
| | | | | 365/185.01 |
| 7,463,520 | B2 * | 12/2008 | Aritome | G11C 16/10 |
| | | | | 365/185.12 |
| 8,014,201 | B2 * | 9/2011 | Park | G11C 11/5642 |
| | | | | 365/185.11 |
| 9,257,182 | B2 * | 2/2016 | Grunzke | G11C 16/06 |
| 2003/0031056 | A1 * | 2/2003 | Roohparvar | G11C 16/20 |
| | | | | 365/185.22 |
| 2006/0015691 | A1 * | 1/2006 | Louie | G11C 29/028 |
| | | | | 711/154 |
| 2007/0047315 | A1 * | 3/2007 | Aritome | G11C 16/102 |
| | | | | 365/185.18 |
| 2007/0177429 | A1 * | 8/2007 | Nagashima | G11C 16/12 |
| | | | | 365/185.22 |
| 2011/0127256 | A1 * | 6/2011 | Qiu | H05B 6/06 |
| | | | | 219/660 |

(Continued)

FOREIGN PATENT DOCUMENTS

JP 2003110034 A * 4/2003

*Primary Examiner* — Jing-Yih Shyu
(74) *Attorney, Agent, or Firm* — Greenberg Traurig

(57) ABSTRACT

A memory device stores data for a host. In one approach, a trim operation is initiated for the memory device (e.g., based on a context that is determined for the memory device). During the trim operation, read and/or write tests are performed on one or more portions of a non-volatile storage media of the memory device. One or more characteristics associated with the memory device are observed during the test. Based on these observed characteristics, one or more trim settings are determined. Then, the memory device is updated to store the determined trim settings to configure subsequent read or write access to the non-volatile storage media (e.g., access performed in response to commands from a host).

19 Claims, 4 Drawing Sheets

(56) References Cited

U.S. PATENT DOCUMENTS

| | | | | |
|---|---|---|---|---|
| 2012/0307866 | A1* | 12/2012 | Chen | G01K 15/005 |
| | | | | 374/170 |
| 2015/0046641 | A1* | 2/2015 | Yoshihara | G06F 13/1689 |
| | | | | 711/105 |
| 2016/0217858 | A1* | 7/2016 | Navon | G11C 29/021 |
| 2019/0317699 | A1* | 10/2019 | Hong | G06F 3/0659 |
| 2019/0354312 | A1* | 11/2019 | Chew | G06F 3/0659 |
| 2020/0082887 | A1* | 3/2020 | Cadloni | G11C 8/06 |

* cited by examiner

ADJUSTING TRIM SETTINGS TO IMPROVE MEMORY PERFORMANCE OR RELIABILITY

FIELD OF THE TECHNOLOGY

At least some embodiments disclosed herein relate to memory devices in general, and more particularly, but not limited to adjusting trim settings for a memory device.

BACKGROUND

Various types of non-volatile storage devices can be used to store data. Non-volatile storage devices can include NAND flash memory devices. NAND flash is a type of flash memory constructed using NAND logic gates. Alternatively, NOR flash is a type of flash memory constructed using NOR logic gates.

Typical computer storage devices have controllers that receive data access requests from host computers and perform programmed computing tasks to implement the requests in ways that may be specific to the media and structure configured in the storage devices. In one example, a flash memory controller manages data stored in flash memory and communicates with a computer device. In some cases, flash memory controllers are used in solid state drives for use in mobile devices, or in SD cards or similar media for use in digital cameras.

Firmware can be used to operate a flash memory controller for a particular storage device. In one example, when a computer system or device reads data from or writes data to a flash memory device, it communicates with the flash memory controller.

In prior NAND flash memory devices, an array of memory cells is arranged such that the control gate of each memory cell of a row of the array is connected to a word line. However, each memory cell is not directly connected to a column bit line by its drain region. Instead, the memory cells of the array are arranged together in strings (often termed NAND strings) (e.g., of 32 each), with the memory cells connected together in series, source-to-drain, between a source line and a column bit line. The memory array for NAND flash memory devices is then accessed by a row decoder activating a row of memory cells by selecting the word line connected to a control gate of a memory cell.

In addition, the word lines connected to the control gates of unselected memory cells of each string are driven to operate the unselected memory cells of each string as pass transistors, so that they pass current in a manner that is unrestricted by their stored data values. Current then flows from the source line to the column bit line through each series connected string, restricted only by the selected memory cells of each string. This places the encoded data values of the row of selected memory cells on the column bit lines.

Memory devices typically include trim circuits that are programmed to output bit values used to provide a variety of options for algorithms that control the operations of the memory device. Such algorithm options may include timing, pulse counts, applied voltage levels, etc. Typically, the trim bit values are programmed once for a memory device and are not changed once the memory device has reached production. Moreover, the bit values are typically applied globally to an entire memory array, which can include thousands of memory blocks, especially for NAND devices. However, as memory array sizes increase, applying the bit values globally to an entire memory array may not be sufficient. Performance variations exist across the array due to factors such as critical dimension (CD) variation within the die and inside the NAND strings. Hence, it is difficult to determine a single trim set that may be applied to the entire array.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
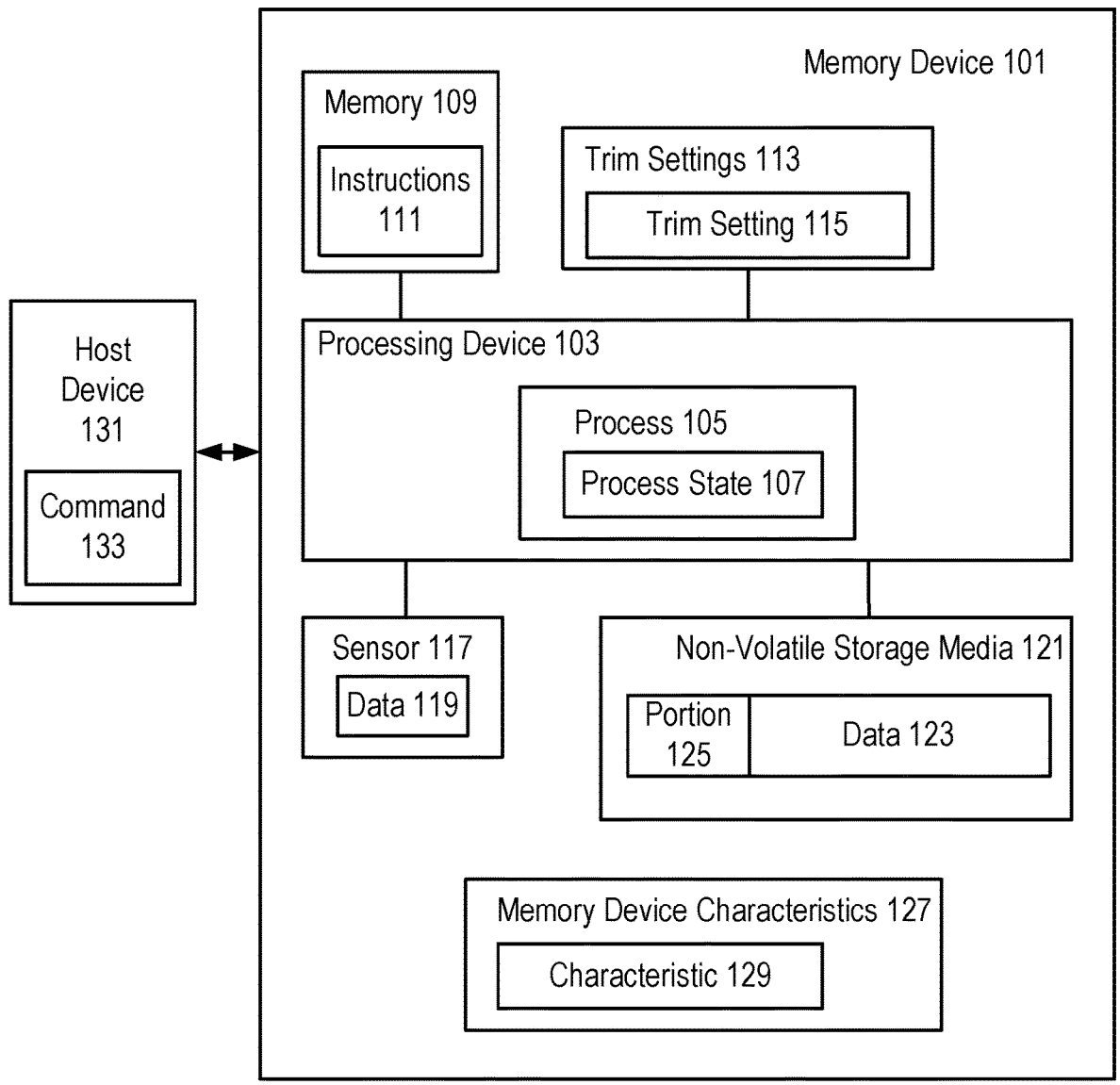
FIG. 1 shows a memory device that dynamically changes trim settings for use in read or write access to a non-volatile storage media, in accordance with some embodiments.

The following disclosure describes various embodiments for dynamically adjusting trim settings for a memory device. At least some embodiments herein relate to adjusting trim settings for a NAND flash memory device (e.g., periodically as it ages over time). Other embodiments relate to adjusting trim settings for a NAND flash memory device as it encounters varying conditions of operation (e.g., changing temperature, radiation, and/or other environmental factors). The memory device may, for example, store data used by a host device (e.g., a computing device of an autonomous vehicle, or another computing device that accesses data stored in the memory device). In one example, the memory device is a solid-state drive mounted in an electric vehicle.

In prior flash memories, a trim setting for a memory device is typically set only once during the manufacturing of the memory device. Then, the trim setting remains unchanged during the life of the memory device. This can significantly degrade performance of the memory device as it fails to work optimally as operating conditions change over time and/or after leaving the manufacturing facility.

Memory devices can be trimmed to optimize specific characteristics such as read or write performance or reliability. Typically, memory device characteristics are tested in the factory and the best trim settings are set once at the time of manufacturing. However, as memory devices age and data is written and read back at different temperatures, the best trim settings may change over time. Furthermore, requirements for a device may change over time. For example, a device may initially be optimized for performance and later, as the devices ages, it may be desirable to optimize the device for reliability.

Regarding setting trim for performance, flash memory cells are written by applying an increasing series of voltage pulses to inject charge into the cell(s) being programmed. If the voltage steps applied to program the flash are increased in larger steps, the flash can be programmed faster. However, larger programming voltage steps increase the risk that other nearby memory cells will be disturbed while programming the first memory cells. Higher voltages can also cause the memory cells to break down over time and become less reliable.

In some cases, temperature can affect the voltage ranges for programming and reading flash memory devices. For a single-level cell flash memory device, which only stores one bit per cell, a voltage range for a bit is either high or low (corresponding to a 1 or 0). For multi-bit flash memory devices, each memory cell can store more than one bit, so that different bit patterns (e.g., 00, 01, 11, 10) can be represented in that cell. Each bit pattern corresponds with a specific voltage range (e.g., Vdd divided into four ranges, each range representing one-fourth of the total voltage).

If a flash memory device is programmed at a low temperature, and then the data is read back at a high temperature, the voltage ranges defined for each bit pattern may have skewed enough that the data is not read back correctly. A similar situation applies for programming at a high temperature and reading back at a low temperature.

Regarding setting trim for reliability, flash memory cells exposed to lower programming voltages will have longer functional lifespans. However, programming flash memory cells will be slower at lower voltages.

Various embodiments of the present disclosure provide a technological solution to technical problems caused by the varying operating conditions of a memory device over time or in changing environments. In some embodiments, trim settings of a memory device are dynamically changed at various times during the life of the memory device to adjust to such varying conditions in order to improve performance or reliability. The trim settings can be changed, for example, to fit thermal, performance, and/or reliability profiles, targets, and/or desired characteristics of a memory device.

In some embodiments, the trim settings are dynamically updated (e.g., at any one or more times) during operation of a memory device (e.g., as a context of operation of the memory device changes, such as due to varying application demands, changing power supply to the memory device, and/or environmental changes). Dynamically changing trim settings has several advantages including, for example, more robust data integrity during fluctuating thermal conditions, optimizing non-volatile storage media access as the memory device ages, and/or dynamically changing memory device optimization at any time. For example, the memory device may initially be optimized for maximum write performance, and then later optimized for maximum read performance. As the memory device ages, it can be optimized for reliability.

In one embodiment, multiple trim settings for different portions of a memory array are dynamically changed. Specifically, a respective trim setting is changed for each of the multiple portions of the memory array. In one example, one or more of the trim settings is dynamically changed at different times than when changing other trim settings for the array.

In one embodiment, a controller of a memory device initiates a trim operation to adjust trim settings (e.g., based on data collected by a sensor and/or received from a host device). In one example, trim optimization is initiated for one or more characteristics. Examples of such characteristics include read performance, write performance, reliability, and/or changing thermal conditions. The trim optimization can be initiated in multiple ways (e.g., a command from a host system, an input from a sensor such as a temperature sensor, and/or an algorithm running on the controller, such as bit error rate or wear leveling, etc.).

In one embodiment, the trim adjustment can be initiated dynamically at any time during the life of the memory device. To determine an appropriate trim adjustment, the controller runs iterative tests on one or more portions of memory using one or more different write/read access parameters (e.g., voltage, timing, etc.) to determine desired or optimal settings for a certain characteristic (e.g., read performance, write performance, reliability, changing thermal conditions, etc.).

In one example, if write tests are performed after the memory device has left the factory, the controller may need to determine where in the memory array that the write tests can be run without overwriting stored data in the array. Alternatively, dedicated portions of the memory array can be reserved for trim testing.

After performing the above tests, the controller calculates desired or optimal trim settings based on results from the tests and, optionally, other inputs (e.g., memory device temperature, etc.). Then, based on these calculations, the controller sets one or more memory device access parameters (e.g., read and/or write access) to the newly-determined trim settings.

FIG. 1 shows a memory device 101 that dynamically changes trim settings for read or write access to a non-volatile storage media 121, in accordance with some embodiments. The host device 131 sends commands 133 to the memory device 101 to write data to the memory device 101, and/or to read data from the memory device 101.

In one embodiment, memory device 101 and host device 131 are part of an electronic system. In one embodiment, the memory device 101 is a non-volatile data storage device, such as, for example, a solid-state drive, solid-state disk, or flash memory card. The host device 131 may be, for example, a computer, computing device, embedded computer, appliance, cell phone or other device that communicates with the memory device 101.

In one embodiment, the memory device 101 includes a processing device 103. The processing device 103 receives and executes commands 133 from the host device 131 (e.g., write or read commands received from host device 131). The processing device 103 may be, for example, a microprocessor, embedded processor, ASIC, FPGA, or other processing device.

The processing device 103 is connected to memory 109 (e.g., a memory device). The processing device 103 receives instructions 111 from the memory 109 that instruct the processing device 103 in processing commands 133. The memory 109 may be, for example, flash memory, SRAM, DRAM, or 3D XPoint memory. In one embodiment, the memory 109 is external to the processing device 103. In one embodiment, the memory 109 is embedded within the processing device 103.

The processing device 103 connects to a non-volatile storage media 121. The non-volatile storage media 121 is used for storing and retrieving data 123. The non-volatile storage media 121 may be, for example, flash memory (including SLC, MLC, TLC, QLC and other types of flash memory), or 3D XPoint memory.

Memory device 101 stores trim settings 113 (e.g., trim settings are stored in a register or other memory of memory device 101). In one embodiment, trim settings 113 enable adjusting the parameters of signals used to access, program, or erase the non-volatile storage media 121. For example, writing data values to non-volatile memory, such as flash memory, may involve sending a series of electrical programming pulses to the memory cells being written. The electrical pulses have a starting voltage and pulse duration. During the series of pulses, the voltage of the pulses may be increased in incremental steps. After a series of electrical pulses, the memory cells are checked to see if they have been written correctly. If the memory cells have not reached the correct voltage, the voltage of the electrical pulses is incremented again and another series of electrical pulses is sent to the memory cells. This process is repeated until the correct values are written to the memory cells or an upper stop voltage is reached. Trim settings 113 provide a way to vary memory access signal parameters such as start voltage, stop voltage, voltage step increment, etc. (e.g., such as associated with the foregoing programming pulses).

Trim settings 113 can be used to adjust, configure, and/or optimize memory device 101 for different characteristics, such as, write performance, read performance, reliability, or changing thermal conditions. For example, when writing data to the non-volatile storage media 121, increasing the electrical pulse starting voltage, voltage step size, and/or stop voltage can speed up writing data to the non-volatile storage media 121.

However, increased voltage on the memory cells being written in the non-volatile storage media 121 can increase the probability that other nearby memory cells will be disturbed. This may cause the data values held in nearby memory cells to change which can impact data integrity or slow down read performance as more time is spent on error correction. Higher voltages applied to memory cells also reduces the total lifespan and reliability of the memory cells. Trim settings 113 can be optimized for reliability, for example, by using lower voltages to access, write and/or erase memory cells. However, optimizing for higher reliability may reduce read or write performance of the non-volatile storage media 121.

Trim settings 113 can be applied to different levels of granularity of the non-volatile storage media 121. For example, there may be different trim settings applied to each page of memory within a block of memory, or to each block of memory, or to groups of blocks of memory within the non-volatile storage media 121.

Trim settings 113 can be stored in several locations within the memory device 101. For example, in one embodiment, trim settings 113 are stored within one or more portions 125 of the non-volatile storage media 121. In one embodiment, trim settings 113 are stored within the memory 109. In one embodiment, trim settings 113 are stored within the processing device 103. In one embodiment, trim settings 113 are stored outside the processing device 103.

In various embodiments, the trim settings 113 can be dynamically changed (e.g., at any time, at predetermined intervals, and/or in response to external signals from a host or other device). Dynamically changing trim settings provides one or more of robust data integrity during fluctuating thermal conditions, optimizing non-volatile storage media 121 access as the memory device 101 ages, and dynamically changing memory device 101 optimization at any time. For example, memory device 101 may initially be adjusted or optimized for maximum write performance and later adjusted or optimized for maximum read performance (e.g., this change in adjustment or optimization can be implemented after a predetermined time has passed from the initial adjustment or in response to a determined event). As memory device 101 ages, its performance, etc., can be optimized for reliability.

Trim settings 113 are typically updated by running a series of tests on the non-volatile storage media 121 while varying one or more memory access, programming, or erase parameters, and then measuring the resulting change in one or more memory device characteristics 127 (e.g., these resulting changes may be stored in a register of memory device 101). In one example, memory write and memory read tests are performed on a portion 125 of the non-volatile storage media 121. During the testing, memory access parameters, such as electrical pulse start voltage, stop voltage, voltage step increment, or pulse duration, may be modified. One or more memory device characteristics 127, such as write speed or erase speed, or disturbance of neighboring memory cells during programming is monitored. Updated trim settings 113 are calculated based on the observed memory device characteristics 127. The updated trim settings 113 are stored and used for subsequent non-volatile storage media 121 accesses, such as reading, writing or erasing the non-volatile storage media 121.

Dynamically changing trim settings 113 after data 123 has been written to the non-volatile storage media 121 may require writing to portions of the non-volatile storage media 121. In one embodiment, one or more portions 125 of the non-volatile storage media 121 are reserved for testing trim settings 113. In one embodiment, portions 125 of the non-volatile storage media 121 are reserved for functions other than storing data 123, including, for example, testing trim settings 113.

Dynamically updating trim settings 113 can be initiated by many events. For example, data 119 from a sensor 117 may be used to initiate updating trim settings 113. In one example, sensor 117 is a temperature sensor. Trim settings 113 are set for memory device 101 while data 119 from sensor 117 indicates memory device 101 is at a first temperature (e.g., a lower temperature below 40 degrees Celsius). Later, data 119 from sensor 117 may indicate the memory device 101 is at a different temperature (e.g., a higher temperature above 40 degrees Celsius) than the first temperature. In one embodiment, memory device 101 may initiate updating trim settings 113 based on the temperature crossing a predetermined threshold.

In one example, trim settings 113 are dynamically updated based on the output of a process 105 running on the processing device 103. For example, process 105 may be a wear-leveling algorithm. Process 105 may determine that one or more memory blocks within the non-volatile storage media 121 have crossed a predetermined threshold for the number of times the blocks have been written. Process 105 may initiate updating trim settings 113 based on crossing a wear-leveling threshold.

In one example, trim settings 113 are dynamically updated based on the process state 107 of process 105 running on the processing device 103. For example, process 105 may be an error correction algorithm. If the rate of errors requiring correction is increasing, or the error correction algorithm starts encountering uncorrectable errors, the process state 107 of the error correction algorithm may dynamically initiate updating trim settings 113 (e.g., process state 107 as determined by processing device 103).

In one example, trim settings 113 are dynamically updated based on a command 133 from host device 131. In one example, host device 131 may know the workload for memory device 101 (e.g., based on a communication from processing device 103 regarding upcoming workloads, processes, or applications). For example, memory device 101 may be used to store sensor data for a scientific experiment. This may be a write-heavy workload requiring fast write performance and have few read cycles. Host device 131 may send a command 133 to the memory device 101 to update trim settings 113 for maximum write performance. Later, the workload may change, for example, when storing sensor data is complete and the data needs to be read out for post-processing. Host device 131 may issue a command 133 to memory device 101 to update trim settings 113 to maximize read performance.

In one example, trim settings 113 are dynamically updated based on an observed first characteristic 129 of memory device 101. For example, data may be written to memory device 101 and a first characteristic 129, such as data write speed or bit error rate for data accesses is observed. Based on the observed first characteristic 129, an update to the trim settings 113 may be initiated.

In one example, memory device 101 is a solid-state drive (SSD). The SSD includes a temperature sensor that measures an external temperature of the ambient atmosphere of the SSD. The trim settings of the SSD can be adjusted at least in part based on the external temperature.

Figure 2:
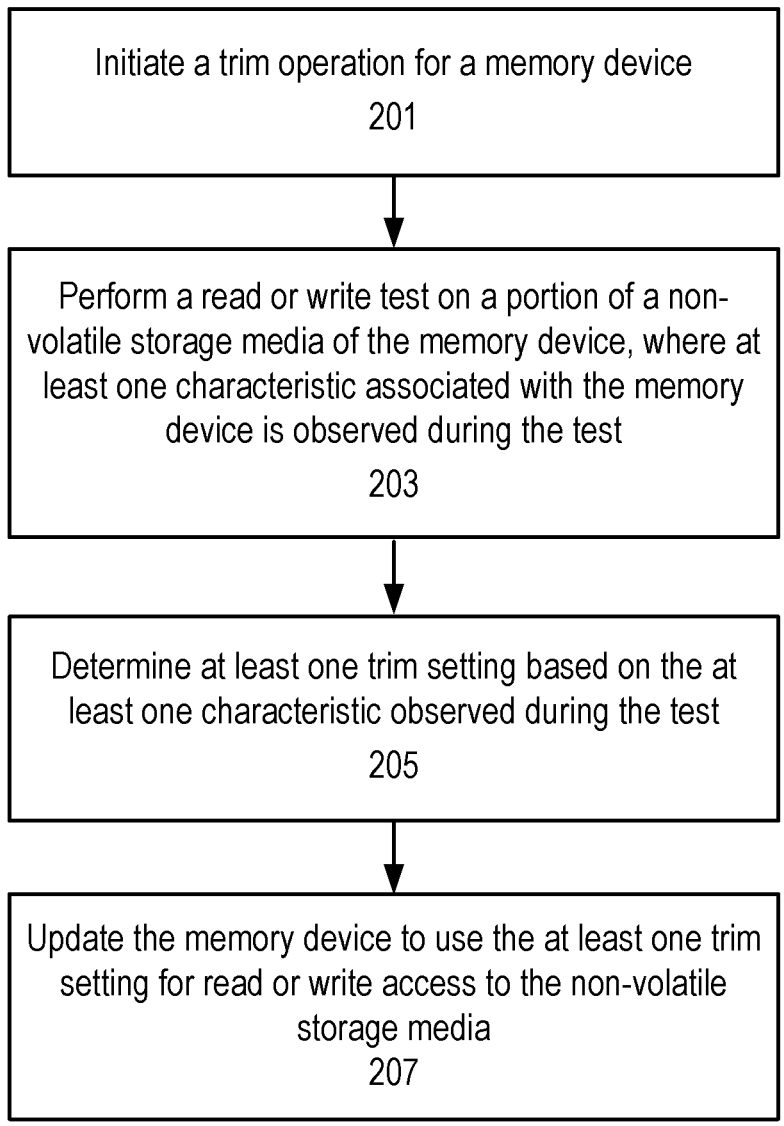
FIG. 2 shows a method for updating a memory device to use new trim settings for read or write access to a non-volatile storage media, in accordance with some embodiments.

FIG. 2 shows a method for updating a memory device to use new trim settings for read or write access to a non-volatile storage media, in accordance with some embodiments. For example, the method of FIG. 2 can be implemented in the system of FIG. 1. In one example, the memory device is memory device 101 and the non-volatile storage media is storage media 121.

The method of FIG. 2 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 2 is performed at least in part by one or more processing devices (e.g., processing device 103 of FIG. 1, or a controller of a flash drive).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 201, a trim operation is initiated for a memory device. In one example, the trim operation is initiated by processing device 103 of memory device 101. In one example, the trim operation is initiated in response to analysis or evaluation of data 119 from sensor 117 and/or a determination of the process state 107 of the process 105.

At block 203, a read and/or write test is performed on a portion of a non-volatile storage media of the memory device. At least one characteristic associated with the memory device is observed during the test. In one example, the read and/or write test is performed on portion 125 of non-volatile storage media 121. In one example, the observed characteristic relates to performance of a memory. In one example, the observed characteristic relates to reliability of the memory.

At block 205, at least one trim setting is determined based on the at least one characteristic observed during the test. In one example, trim setting 115 is determined based on the observed characteristic(s).

At block 207, the memory device is updated to use the at least one trim setting for read/write access to the non-volatile storage media. In one example, processing device 103 performs read or write accesses using updated trim setting 115. In one example, processing device 103 performs memory access based on updated trim setting 115 in response to commands 133 from host device 131.

In one embodiment, a method for a memory device (e.g., memory device 101) comprises: determining to initiate a trim operation for the memory device; in response to determining to initiate the trim operation, performing a read or write test on a portion (e.g., portion 125) of a non-volatile storage media (e.g., non-volatile storage media 121) of the memory device, wherein at least one characteristic associated with the memory device is observed during the test; determining, based on the observed at least one characteristic, at least one trim setting (e.g., trim setting 115); and updating the memory device to use the at least one trim setting for read or write access to the non-volatile storage media.

In one embodiment, the at least one trim setting is a voltage parameter or a timing parameter.

In one embodiment, determining the at least one trim setting is further based on a temperature of the memory device.

In one embodiment, the at least one characteristic is at least one of read performance, write performance, reliability, or a thermal condition.

In one embodiment, determining to initiate the trim operation comprises at least one of: receiving temperature data from a sensor (e.g., sensor 117); receiving a command (e.g., command 133) from a host device (e.g., host device 131) that sends read or write commands to the memory device; receiving data from at least one sensor of the memory device; determining an output from a process (e.g., process 105) running on the memory device; or determining a state of a process (e.g., process state 107) running on the memory device.

In one embodiment, determining to initiate the trim operation comprises determining an output from a process running on the memory device, and wherein the process is associated with management of at least one of bit error rate or wear leveling.

In one embodiment, performing the read or write test comprises varying read or write access parameters associated with read or write access to the non-volatile storage media.

In one embodiment, the method further comprises: prior to determining to initiate the trim operation, storing data in the non-volatile storage media in response to a write command from a host device, and observing a first characteristic of the memory device; wherein determining to initiate the trim operation is based at least in part on the observed first characteristic.

In one embodiment, observing the first characteristic comprises observing a change in a thermal condition associated with the memory device.

In one embodiment, the read or write test is performed by a controller of the memory device, and the portion of the non-volatile storage media is reserved by the controller for trim testing.

In one embodiment, the method further comprises: receiving a write command from a host device when the memory device is operating in a normal read/write mode; in response to receiving the write command, storing data in the non-volatile storage media; and while storing the data, determining a first characteristic associated with the memory device. Determining to initiate the trim operation is based at least in part on the determined first characteristic.

In one embodiment, determining the first characteristic comprises at least one of determining a thermal condition of the non-volatile storage media, or determining an ambient temperature of the memory device.

In one embodiment, the method further comprises: storing a first trim setting for the memory device; performing, using the first trim setting, at least one of read or write accesses to the non-volatile storage media; determining a change in at least one characteristic of the memory device that is associated with the read or write accesses; and determining that the change in the at least one characteristic occurs over at least a predetermined time period. Determining to initiate the trim operation is based at least in part on determining that the change in the at least one characteristic occurs over at least the predetermined time period. Updating the memory device comprises updating the first trim setting.

In one embodiment, a memory device comprises: at least one sensor; a non-volatile storage media; at least one processing device; and memory containing instructions configured to instruct the at least one processing device to: collect data using the at least one sensor; determine, based on the collected data, to initiate a trim operation; in response to determining to initiate the trim operation, perform a test on a portion of the non-volatile storage media, wherein at least one characteristic associated with the memory device is observed during the test; determine, based on the observed at least one characteristic, at least one trim setting; and update the memory device to use the at least one trim setting for read or write access to the non-volatile storage media.

In one embodiment, the instructions are further configured to instruct the at least one processing device to: set a first trim setting corresponding to programming at a first temperature of the memory device; wherein determining to initiate the trim operation comprises determining a second temperature of the memory device that is higher than the first temperature; wherein determining the at least one trim setting comprises determining a second trim setting. Updating the memory device comprises using the second trim setting. A read access time of the memory device when using the second trim setting is less than a read access time of the memory device when using the first trim setting.

In one embodiment, the at least one sensor comprises a temperature sensor.

In one embodiment, the instructions are further configured to instruct the at least one processing device to: set a prior trim setting for the memory device at a time when the temperature sensor determines a first temperature associated with the memory device. Determining to initiate the trim operation comprises: determining, using the temperature sensor, a second temperature associated with the memory device; and determining that the second temperature differs from the first temperature by at least a predetermined threshold. Updating the memory device comprises updating the prior trim setting to the determined at least one trim setting.

In one embodiment, the instructions are further configured to instruct the at least one processing device to: determine a first portion of the non-volatile storage media that is not used to store data. The test is performed on the first portion.

In one embodiment, a non-transitory computer-readable medium stores instructions which, when executed on a memory device, cause the memory device to at least: determine to initiate a trim operation; in response to determining to initiate the trim operation, perform a test on a portion of a non-volatile storage media of the memory device, wherein at least one characteristic is observed during the test; determine, based on the observed at least one characteristic, at least one trim setting; and update the memory device to use the at least one trim setting.

In one embodiment, determining to initiate the trim operation comprises determining that a number of programming cycles for a first portion of the non-volatile storage media exceeds a predetermined threshold (e.g., a predetermined number that corresponds to reduced or undesired reliability). The at least one trim setting comprises a trim setting for the first portion.

Figure 3:
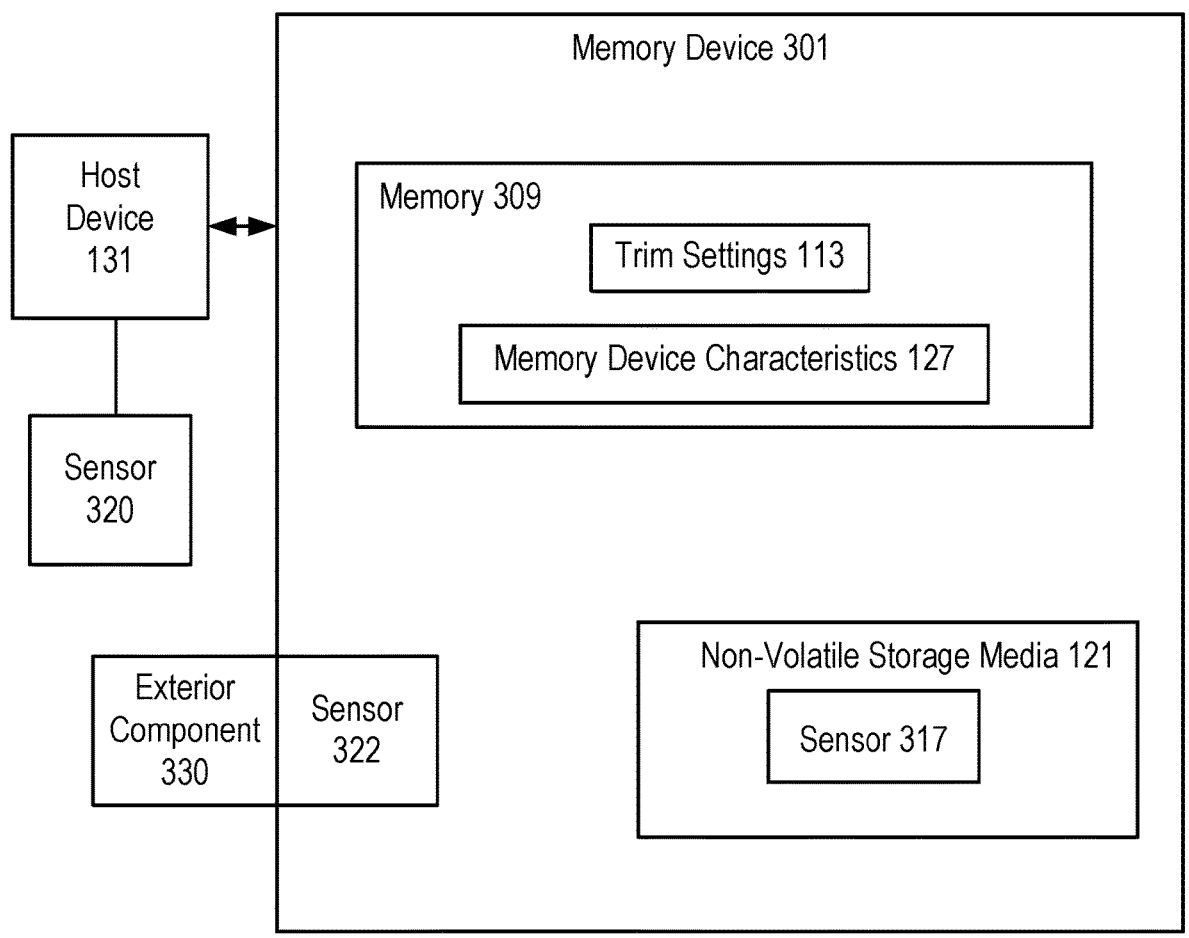
FIG. 3 shows a memory device that changes trim settings for read or write access based on a temperature comparison, in accordance with some embodiments.

FIG. 3 shows a memory device 301 that changes trim settings for read or write access based on a temperature comparison, in accordance with some embodiments. Sensor 317 determines a temperature of non-volatile storage media 121. Sensor 322 determines a temperature of an exterior component 330. In one example, exterior component 330 is a package or other container of memory device 301. In one example, exterior component 330 is a frame or other component into or onto which memory device 301 is mounted or otherwise attached. In one example, exterior component is a component that is separate from memory device 301 (e.g., an engine component of a vehicle).

In one embodiment, sensor 322 determines an ambient temperature of an atmosphere around memory device 301. In one embodiment, sensor 322 determines a temperature outside of a vehicle in which memory device 301 is mounted.

In one embodiment, sensor 320 is a temperature sensor of host device 131. In one example, sensor 320 determines an ambient temperature of an atmosphere around memory device 301 and/or outside of a vehicle in which memory device 301 is mounted.

Memory 309 stores trim settings 113 and a memory device characteristics 127. Trim settings 113 are determined from a trim operation. In one embodiment, the trim operation is initiated based on a comparison of temperatures determined using prior and/or current temperatures from any of sensors 317, 320, and/or 322. In one example, a current temperature of sensor 317 is compared to a current temperature of sensor 320 or 322. In one example, a prior temperature of sensor 317 is compared to a current temperature of sensor 317.

During the trim operation, a read or write test is performed on a portion of non-volatile storage media 121. Characteristics 127 that are observed during the test are stored in memory 309. Memory 309 can be, for example, volatile or non-volatile memory.

New trim settings are determined from the trim operation. The new trim settings are used to update prior trim settings. In one example, trim settings 113 are updated using the new trim settings.

Figure 4:
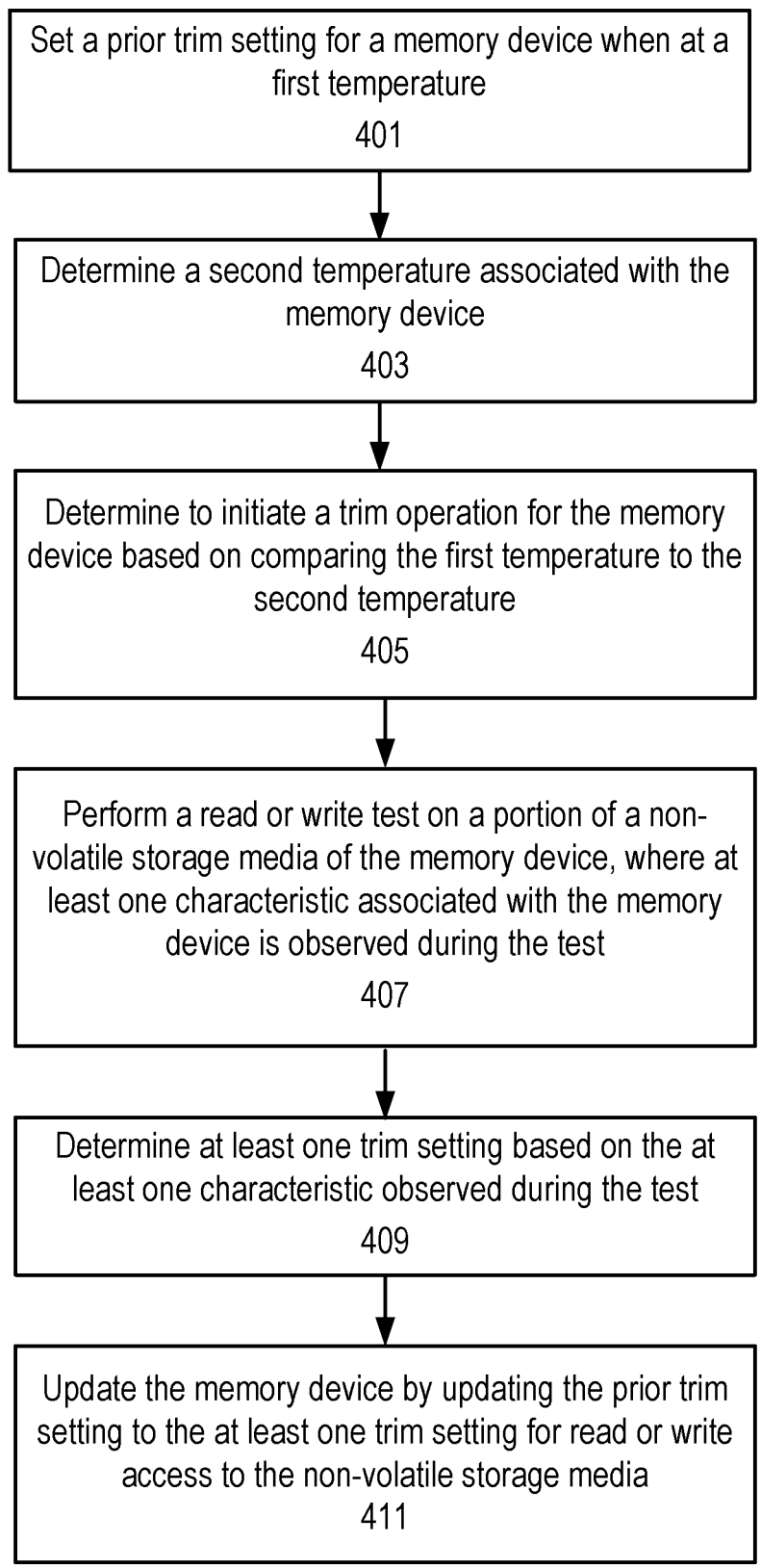
FIG. 4 shows a method for updating trim settings for a memory device based on a temperature comparison, in accordance with some embodiments.

FIG. 4 shows a method for updating trim settings for a memory device based on a temperature comparison, in accordance with some embodiments. For example, the method of FIG. 4 can be implemented in the system of FIG. 3. In one example, the memory device is memory device 301.

The method of FIG. 4 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 4 is performed at least in part by one or more processing devices (e.g., a controller of a solid state drive).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 401, a prior trim setting for a memory device is set when the memory device is at a first temperature. In one example, the first temperature is determined by a prior temperature of sensor 317. In one example, the first temperature is determined by sensor 320 or sensor 322.

At block 403, a second temperature associated with the memory device is determined. In one example, the second temperature is determined by a current temperature of sensor 317. In one example, the second temperature is determined by sensor 320 or sensor 322.

At block 405, it is determined to initiate a trim operation for the memory device based on comparing the first temperature to the second temperature. In one example, a prior temperature of sensor 317 is compared to a current temperature of sensor 317. In one example, a prior temperature of sensor 322 is compared to a current temperature of sensor 317.

At block 407, a read or write test is performed on a portion of a non-volatile storage media of the memory device. At least one characteristic associated with the memory device is observed during the test. In one example, the characteristic is stored in memory 309.

At block 409, at least one trim setting is determined based on the at least one characteristic observed during the test. In one example, the trim setting is stored in memory 309.

At block 411, the memory device is updated by updating the prior trim setting to the determined at least one trim setting for read or write access to the non-volatile storage media. In one example, the read or write access occurs due to commands received from host device 131.

The disclosure includes various devices which perform the methods and implement the systems described above, including data processing systems which perform these methods, and computer-readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and/or operations may be described as being performed by or caused by software code to simplify description. However, those skilled in the art will recognize what is meant by such expressions is that the functions and/or operations result from execution of the code by one or more processing devices, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of computer-readable medium used to actually effect the distribution.

At least some aspects disclosed can be embodied, at least in part, in software. That is, the techniques may be carried out in a computing device or other system in response to its processing device, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions (sometimes referred to as computer programs). Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A computer-readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a computer-readable medium in entirety at a particular instance of time.

Examples of computer-readable media include but are not limited to recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions.

In general, a non-transitory computer-readable medium includes any mechanism that provides (e.g., stores) information in a form accessible by a computing device (e.g., a computer, mobile device, network device, personal digital assistant, manufacturing tool having a controller, any device with a set of one or more processors, etc.).

In various embodiments, hardwired circuitry may be used in combination with software and firmware instructions to implement the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

In one example, a computing device is a controller of a memory system. The controller includes a processing device and memory containing instructions executed by the processing device to control various operations of the memory system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A method comprising:
    determining, by a processing device of a memory device, to initiate a trim operation for the memory device based at least in part on a sensor input or an operating condition of the memory device;
    in response to determining to initiate the trim operation, performing, by the processing device, a read or write test on a portion of a non-volatile storage media of the memory device, wherein at least one characteristic associated with the memory device is observed during the test, and the at least one characteristic comprises read performance when reading data from the non-volatile storage media, or write performance when writing data to the non-volatile storage media;
    determining, based on the observed at least one characteristic, at least one trim setting, wherein the trim setting comprises a voltage parameter or a timing parameter; and
    updating the memory device to use the at least one trim setting for read or write access to the non-volatile storage media.

2. The method of claim 1, wherein determining the at least one trim setting is further based on a temperature of the memory device.

3. The method of claim 1, wherein the at least one characteristic further comprises reliability, or a thermal condition.

4. The method of claim 1, wherein determining to initiate the trim operation comprises at least one of:
    receiving temperature data from a sensor;
    receiving a command from a host device that sends read or write commands to the memory device;
    receiving data from at least one sensor of the memory device;
    determining an output from a process running on the memory device; or
    determining a state of a process running on the memory device.

5. The method of claim 1, wherein determining to initiate the trim operation comprises determining an output from a process running on the memory device, and wherein the process is associated with management of at least one of bit error rate or wear leveling.

6. The method of claim 1, wherein performing the read or write test comprises varying read or write access parameters associated with read or write access to the non-volatile storage media.

7. The method of claim 1, further comprising:
    prior to determining to initiate the trim operation, storing data in the non-volatile storage media in response to a write command from a host device, and observing a first characteristic of the memory device;
    wherein determining to initiate the trim operation is based at least in part on the observed first characteristic.

8. The method of claim 7, wherein observing the first characteristic comprises observing a change in a thermal condition associated with the memory device.

9. The method of claim 1, wherein the processing device is a controller, and wherein the portion of the non-volatile storage media is reserved by the controller for trim testing.

10. The method of claim 1, further comprising:
receiving a write command from a host device when the memory device is operating in a normal read/write mode;
in response to receiving the write command, storing data in the non-volatile storage media; and
while storing the data, determining a first characteristic associated with the memory device;
wherein determining to initiate the trim operation is based at least in part on the determined first characteristic.

11. The method of claim 10, wherein determining the first characteristic comprises at least one of determining a thermal condition of the memory device, or determining an ambient temperature of the memory device.

12. The method of claim 1, further comprising:
storing a first trim setting for the memory device;
performing, using the first trim setting, at least one of read or write accesses to the non-volatile storage media;
determining a change in at least one characteristic of the memory device that is associated with the read or write accesses; and
determining that the change in the at least one characteristic occurs over at least a predetermined time period;
wherein determining to initiate the trim operation is based at least in part on determining that the change in the at least one characteristic occurs over at least the predetermined time period;
wherein updating the memory device comprises updating the first trim setting.

13. A memory device comprising:
at least one sensor;
a non-volatile storage media;
at least one processing device; and
memory containing instructions configured to instruct the at least one processing device to:
collect data using the at least one sensor;
determine, based on the collected data, to initiate a trim operation;
in response to determining to initiate the trim operation, perform a test on a portion of the non-volatile storage media, wherein at least one characteristic associated with the memory device is observed during the test, and the at least one characteristic comprises read performance when reading data, or write performance when storing data;
determine, based on the observed at least one characteristic, at least one trim setting, wherein the trim setting comprises a voltage parameter or a timing parameter; and
update the memory device to use the at least one trim setting for read or write access to the non-volatile storage media.

14. The device of claim 13, wherein the instructions are further configured to instruct the at least one processing device to:
set a first trim setting corresponding to programming at a first temperature of the memory device;
wherein determining to initiate the trim operation comprises determining a second temperature of the memory device that is higher than the first temperature;
wherein determining the at least one trim setting comprises determining a second trim setting;
wherein updating the memory device comprises using the second trim setting; and
wherein a read access time of the memory device when using the second trim setting is less than a read access time of the memory device when using the first trim setting.

15. The device of claim 13, wherein the at least one sensor comprises a temperature sensor.

16. The device of claim 15, wherein the instructions are further configured to instruct the at least one processing device to:
set a prior trim setting for the memory device at a time when the temperature sensor determines a first temperature associated with the memory device;
wherein determining to initiate the trim operation comprises:
determining, using the temperature sensor, a second temperature associated with the memory device; and
determining that the second temperature differs from the first temperature by at least a predetermined threshold;
wherein updating the memory device comprises updating the prior trim setting to the determined at least one trim setting.

17. The device of claim 13, wherein the instructions are further configured to instruct the at least one processing device to:
determine a first portion of the non-volatile storage media that is not used to store data;
wherein the test is performed on the first portion of the non-volatile storage media.

18. A non-transitory computer-readable medium storing instructions which, when executed on a memory device, cause the memory device to at least:
determine to initiate a trim operation based at least in part on a sensor input or an operating condition of the memory device;
in response to determining to initiate the trim operation, perform a test on a portion of a non-volatile storage media of the memory device, wherein at least one characteristic is observed during the test, and the at least one characteristic comprises read performance when reading data, or write performance when storing data;
determine, based on the observed at least one characteristic, at least one trim setting, wherein the trim setting comprises a voltage parameter or a timing parameter; and
update the memory device to use the at least one trim setting.

19. The non-transitory computer-readable medium of claim 18, wherein determining to initiate the trim operation comprises:
determining that a number of programming cycles for a first portion of the non-volatile storage media exceeds a predetermined threshold;
wherein the at least one trim setting comprises a trim setting for the first portion of the non-volatile storage media.

* * * * *